United States Patent
Fautz (10) Patent No.: US 9,726,743 B2
(45) Date of Patent: Aug. 8, 2017

(54) MAGNETIC RESONANCE METHOD AND APPARATUS WHEREIN SIGNAL CONTRIBUTIONS OUTSIDE OF THE MEASUREMENT REGION ARE REDUCED

(71) Applicant: Hans-Peter Fautz, Forchheim (DE)

(72) Inventor: Hans-Peter Fautz, Forchheim (DE)

(73) Assignee: Siemens Aktiengesellschaft, Munich (DE)

( * ) Notice: Subject to any disclaimer, the term of this patent is extended or adjusted under 35 U.S.C. 154(b) by 734 days.

(21) Appl. No.: 14/173,176

(22) Filed: Feb. 5, 2014

(65) Prior Publication Data
US 2014/0218027 A1    Aug. 7, 2014

(30) Foreign Application Priority Data

Feb. 5, 2013   (DE) .................. 10 2013 201 814

(51) Int. Cl.
*G01V 3/00*     (2006.01)
*G01R 33/561*   (2006.01)
*G01R 33/483*   (2006.01)

(52) U.S. Cl.
CPC ....... *G01R 33/561* (2013.01); *G01R 33/4836* (2013.01); *G01R 33/4838* (2013.01); *G01R 33/5613* (2013.01)

(58) Field of Classification Search
CPC ............. G01R 33/561; G01R 33/4836; G01R 33/4838; G01R 33/5613
USPC ........................................... 324/309
See application file for complete search history.

(56) References Cited

U.S. PATENT DOCUMENTS

| | | | | |
|---|---|---|---|---|
| 5,256,967 A * | 10/1993 | Foo | ...... | G01R 33/561 324/309 |
| 5,347,216 A * | 9/1994 | Foo | ...... | G01R 33/561 324/309 |
| 8,198,892 B2 * | 6/2012 | Doyle | ...... | G01R 33/5613 324/309 |
| 8,269,494 B2 * | 9/2012 | Lee | ...... | G01R 33/5613 324/309 |

(Continued)

OTHER PUBLICATIONS

Singh et al.: "Selective Saturation of Volumes of Tailored Shape for Black Blood Magnetic Resonance Angiography"; Concepts Magn. Reson. 8; pp. 33-48; (1996).

(Continued)

*Primary Examiner* — Susan Lee
(74) *Attorney, Agent, or Firm* — Schiff Hardin LLP (57) ABSTRACT

In magnetic resonance imaging using a measurement sequence of the "free precession of transverse magnetization in the steady state"-type i.e., an SSFP measurement sequence, during the SSFP measurement sequence, the implementation of a preparation sequence takes place to reduce a signal contribution of the transverse magnetization in an outer region surrounding a measurement region in the MR imaging. The implementation of the preparation sequence includes the radiation of a multidimensional, spatially selective RF pulse that acts in a spatially selective manner on the transverse magnetization in the outer region. Saturation of the transverse magnetization and/or dephasing of the transverse magnetization in the outer region can be achieved by the multidimensional, spatially selective RF pulse.

16 Claims, 7 Drawing Sheets

(56) References Cited

U.S. PATENT DOCUMENTS

| | | | |
|---|---|---|---|
| 2005/0174114 A1* | 8/2005 | Mugler, III | G01R 33/5613 324/309 |
| 2009/0143666 A1* | 6/2009 | Edelman | G01R 33/5635 600/410 |
| 2009/0251143 A1 | 10/2009 | Yui | |
| 2010/0063380 A1 | 3/2010 | Duerk et al. | |
| 2012/0025824 A1 | 2/2012 | Harder et al. | |
| 2012/0235678 A1* | 9/2012 | Seiberlich | G01R 33/543 324/307 |
| 2012/0293172 A1 | 11/2012 | Wheaton et al. | |

OTHER PUBLICATIONS

Katoh et al; "Free-breathing renal MR angiography with steady-state free-precession (SSFP) and slab-selective spin inversion: Initial results"; Kidney International, Technical Note; vol. 66; No. 3; pp. 1272-1278; (2004).
Riesenberg et al: "Two-Dimensional Spatially-Selective RF Excitation Pulses in Echo-Planar Imaging", Magnetic Resonance in Medicine 47, pp. 1186-1193, (2002).
Katscher et al: "Parallel RF transmission in MRI", NMR Biomed., vol. 19 (3), pp. 393-400. (2006).
Wald et al: "Paralle Transmit Technology for High Field MRI", MAGNETOM Flash, (2009).
Scheffler et al: "Magnetization Preparation During the Steady State: Fat-Saturated 3D TrueFISP"; Magnetic Resonance in Medicine, vol. 45, pp. 1075-1080, (2001).

* cited by examiner

MAGNETIC RESONANCE METHOD AND APPARATUS WHEREIN SIGNAL CONTRIBUTIONS OUTSIDE OF THE MEASUREMENT REGION ARE REDUCED

BACKGROUND OF THE INVENTION

Field of the Invention

The present invention concerns a method for magnetic resonance imaging with a measurement sequence of the "free precession of transverse magnetization in the steady state"-type—an SSFP measurement sequence—and a magnetic resonance system for implementing such a method. In particular, the invention concerns measurement sequences that include the radiation of a multidimensional, spatially selective radio-frequency pulse.

Description of the Prior Art

Magnetic resonance (MR) tomography is an imaging method that enables the acquisition of two-dimensional or three-dimensional image data sets that can depict structures inside an examined person with high resolution. In MR imaging, the magnetic moments of protons in an examination subject are aligned in a basic magnetic field so that a macroscopic magnetization arises along a longitudinal direction. This is subsequently deflected (excitation) out of the steady state parallel to the basic magnetic field (longitudinal magnetization) by the radiation of radio-frequency (RF) pulses. A transverse magnetization is thereby generated. Special RF transmission coils of an MR system are typically used for radiation.

The decay of the transverse magnetization back into the steady state or the magnetization dynamic is subsequently detected (imaging) by means of one or more RF reception coils of the MR system as MR data. A spatial coding of the acquired MR data is achieved by the application of different magnetic field gradients (for slice selection, phase coding or readout coding). The transverse magnetization in a defined slice is excited out of the steady state with conventional RF pulses via the simultaneous switching of the slice selection gradient field. The excitation is typically not limited within the slice, and therefore can be designated as one-dimensionally (1D) spatially selective. A targeted dephasing/rephasing of the transverse magnetization to obtain a signal known as a gradient echo by the application of the phase coding and readout gradient fields. The acquired MR signals i.e, the detected (and therefore spatially resolved) MR data initially exist as raw data in the spatial frequency domain (called k-space), and can be transformed into the spatial domain (image space) by subsequent Fourier transformation. K-space can be scanned (data entered therein) along a well-defined k-space trajectory by means of the gradient fields.

A need frequently exists for measurement sequences that have a spatially limited measurement region. This can be the case when a relevant region (region of interest, ROI) is relatively limited, for instance due to anatomical conditions of an examined person.

Techniques are known for this that discard MR data outside of the measurement region based on an image segmentation of the MR images. However, the unnecessary acquisition of MR signals outside of the measurement region can unnecessarily extend the entire time period that is required to implement the measurement sequence (measurement duration).

Further-developed RF pulses—for instance for multidimensional, spatially selective excitation—have recently been designed, for example attempts to shorten the measurement duration. Such multidimensional, spatially selective RF pulses can use special k-space trajectories to excite the transverse magnetization. Clearly spatially defined (and limited, for example) regions in two dimensions (2d) or three dimensions (3d) can thereby be excited with a specific, well-defined phase of the transverse magnetization. For example, gradient fields along multiple axes can be used for this. It is also possible to provide a special amplitude modulation of the multidimensional, spatially selective RF pulse. For instance, examples of such pulses are known from "Two-Dimensional Spatially-Selective RF Excitation Pulses in Echo-Planar Imaging" by S. Riesenberg et al. in Mag. Reson. Med. 47 (2002) 1186-1193.

In comparison to conventional RF pulses (for example 1D slice-selective RF pulses), such multidimensional, spatially selective RF pulses can require a longer time period for implementation. However, the number of scanning points in the imaging can be limited, and the overall measurement duration thus can be reduced.

However, physiological restrictions can limit or preclude the use of such multidimensional, spatially selective RF pulses. For instance, in cardiac imaging the time period required to implement the RF pulse can be severely limited due to heart movement, etc. Typical acceptable time durations can be in the range of a few milliseconds, for instance in the range of 1 ms. Typical known multidimensional RF pulses can be used only as limited to such short time scales. This particularly applies to fast measurement sequences for MR imaging that utilize a free precession of the transverse magnetization in the steady state. Such measurement sequences are also designated as SSFP (Steady State Fast Precession) measurement sequences. In general, SSFP measurement sequences can be categorized as a gradient echo sequence with a repetition time TR that is shorter than the T1 relaxation time.

SUMMARY OF THE INVENTION

Therefore, a need exists for SSFP measurement sequences for MR imaging which have a comparably short measurement duration. In particular, a need exists for such SSFP measurement sequences that require a comparably short duration for the excitation and that have a spatially limited measurement range.

This need is addressed by a method according to the invention, for MR imaging with a measurement sequence of the "free precession of transverse magnetization in the steady state"-type for a measurement region of an examination subject. The method includes the implementation of the SSFP measurement sequence for MR imaging in the measurement region, wherein the implementation of the SSFP measurement sequence includes the radiation of RF pulses to excite the transverse magnetization. The radiated RF pulses act on the transverse magnetization in the measurement region and in an outer region that surrounds and adjoins the measurement region. During the implementation of the SSFP measurement sequence in MR imaging, the method furthermore includes the implementation of a preparation sequence to reduce a signal contribution of the transverse magnetization into the outer region. The implementation of the preparation sequence comprises the radiation of a multidimensional, spatially selective RF pulse that acts in a spatially selective manner on the transverse magnetization in the outer region.

The SSFP measurement sequence furthermore includes acquisition of MR signals for the MR imaging. The acquisition of the MR signals can take place for scan points along a k-space trajectory. The SSFP measurement sequence can furthermore include processing of the MR signals to obtain an MR image. The processing of the MR signals can include a Fourier transformation of the scanning points from k-space into positional space. The MR image can then depict the measurement region.

Various techniques for the implementation of the SSFP measurement sequence are known to those skilled in the field of magnetic resonance imaging. In principle, the effect can be utilized that a steady state of the respective longitudinal magnetization that is present again arises given a comparably short repetition time between the radiation of successive RF pulses to excite the transverse magnetization. This can be the case if the characteristic relaxation time T1 of the transverse magnetization back into the steady state of the longitudinal magnetization is shorter than the repetition time, i.e. the time between successive RF pulses to excite the transverse magnetization. In this regard, the radiation of the RF pulses to excite the transverse magnetization means that the RF pulses is radiated to maintain the steady state of the transverse magnetization. Because such techniques are known in principle to those skilled in the art, for example under the synonym TrueFISP, additional details need not be explained herein.

For example, the examination subject can be an examined person. The measurement region can designate a region of the examined person for which the MR imaging is sought. For example, there can be medical or anatomical reasons for this since organs or structures are arranged directly in this measurement region. The measurement region can also be designated as an ROI. Depending on the SSFP measurement sequence that is used, the measurement region can have different geometric shapes, for example can be cuboid or spherical. The outer region can surround the measurement region and/or adjoin at least one or all sides of the measurement region. The outer region can partially or entirely surround the measurement region. While the structures of interest for the MR imaging can be arranged within the measurement region, it can be possible for no structures of interest to be arranged in the outer region. Therefore, it can be desirable to implement the MR imaging such that no signal contribution or only a slight signal contribution is obtained from the outer region, so the measurement duration can thereby be reduced.

For example, the RF pulses radiated for the implementation of the SSFP measurement sequence can be conventional RF pulses, for example 1D slice-selective RF pulses; in particular, they need not be multidimensional, spatially selective RF pulses. For example, conventional RF pulses can be implemented by simultaneous application of a slice-selection gradient field, i.e. excite transverse magnetization in a defined 1D slice of the examination subject. Such RF pulses can typically have an amplitude modulation of a radio-frequency portion. The amplitude modulation can typically be described by a time curve that corresponds to a sinc function. During the implementation of the SSFP measurement sequence, the preparation sequence can be implemented once or multiple times in order to reduce the signal contribution in the MR data due to the transverse magnetization in the outer region in the MR imaging. For example, a repetition time with which the preparation sequence is implemented can be correlated with (or occur on a comparable time scale as) the relaxation time of the transverse magnetization in the outer region.

The signal that is obtained from the outer region in the MR imaging can be suppressed via the implementation of the preparation sequence. For this purpose, the parameter of the multidimensional, spatially selective RF pulse (for example amplitude modulation, radio-frequency portion, accompanying gradient fields, etc.) can be selected accordingly so that the multidimensional, spatially selective RF pulse acts only on the transverse magnetization that is arranged in the outer region. This can typically be achieved in that a special k-space trajectory is excited by the multidimensional, spatially selective RF pulse. A Fourier transformation of the k-space trajectory can then accordingly include the outer region.

For example, the multidimensional, spatially selective RF pulse can be made spatially selective by the use of an amplitude modulation of a radio-frequency of said RF pulse, and by the use of spatially coding gradient fields during the application of the radio-frequency pulse.

Alternatively or additionally, the multidimensional, spatially selective RF pulse can be made spatially selective by the use of multiple RF coils controlled in a temporally overlapping manner.

Appropriate techniques are known in principle to those skilled in the art as parallel transmission; see for example "Parallel RF transmission in MRI" by U. Katscher and P. Börnert in NMR Biomed. 19 (2006) 393-400, and "Parallel Transmit Technology for High Field MRI" by L. K. Wald and E. Adalsteinsson in MAGNETOM Flash 1 (2009) 124. The spatial selectiveness can be achieved in part or entirely through different sensitivity profiles in the coordinate system of the RF coils that are used. In particular, the sensitivity profiles of the RF coils can have maxima at different points in this coordinate system, and possibly a qualitatively and/or quantitatively comparable spatial dependency. In particular, by the use of techniques for parallel transmission the time period that is required to implement the multidimensional, spatially selective RF pulse can be reduced.

The reduced duration that is required to implement the multidimensional, spatially selective RF pulse can be achieved by the use of the multidimensional, spatially selective RF pulse that acts (selectively, for example) on the transverse magnetization in the outer region. This can be the case since—due to the multidimensional, spatially selective RF pulse—the transverse magnetization is manipulated in a region that is not the subject of the MR imaging. For example, it is possible for the multidimensional, spatially selective RF pulse of the preparation sequence not to act on the transverse magnetization in the measurement region.

Because the transverse magnetization in the outer region is not required for the imaging, strict requirements can be placed on the quality of the manipulation of the transverse magnetization via the multidimensional, spatially selective RF pulse, for instance in particular with regard to phase-coherent excitation and/or well-defined amplitude of the transverse magnetization. In other words: it can be unnecessary that the transverse magnetization excited by the multidimensional, spatially selective RF pulse be usable for the MR imaging.

By the use of the multidimensional, spatially selective RF pulse that acts on the transverse magnetization in the outer region, a reduced radio-frequency exposure of the examination subject or of the examined person can be achieved as a further effect. This can be the case since an amplitude of the multidimensional, spatially selective RF pulse can be selected to be comparably lower. For example, the absorption rate (SAR, Specific Absorption Rate) of the radiated alternating electromagnetic field in the examination subject or, respectively, the examined person can be reduced.

For the reduction of the signal contribution of the transverse magnetization in the outer region in MR imaging, the various scenarios individually or in combination with one another are possible insofar as the multidimensional, spatially selective RF pulse is used.

For example, the multidimensional, spatially selective RF pulse can saturate the transverse magnetization in the outer region. Saturation means that the longitudinal magnetization is converted completely or predominantly into transverse magnetization, such that after the implementation of the preparation sequence no (or only a slight) additional longitudinal magnetization is initially available for excitation, or for subsequent imaging.

Such techniques that include the saturation of the transverse magnetization in the outer region can also be designated as outer volume saturation (OVS).

It is also possible for the multidimensional, spatially selective RF pulse to excite and/or dephase the transverse magnetization incoherently in terms of phase in the outer region. The phase-incoherent excitation means that it is not possible, or is possible only to a limited extent, to generate a collective gradient echo and/or spin echo via application of gradient fields and/or refocusing pulses. This can be the case since the transverse magnetization has a different phase position at different points in space as a result of the phase-incoherent excitation. A collective rephasing of the transverse magnetization can then be prevented.

The dephasing of the transverse magnetization by radiation of the multidimensional, spatially selective RF pulse can accordingly mean: targeted impression of a phase shift on the transverse magnetization. By the targeted dephasing of the transverse magnetization, for example by imposing a comparably large difference phase, it can be possible to subsequently apply a variety of gradient fields (for example within the scope of the SSFP measurement sequence) without producing a rephasing of the transverse magnetization in the outer region. While the transverse magnetization can thus be rephased in the measurement region by switching of suitable gradient fields within the scope of the SSFP measurement sequence to obtain gradient echoes, a difference phase of the previously dephased transverse magnetization can remain in the outer region and prevent the transverse magnetization in the outer region from supplying a signal contribution to the gradient echo.

This phase-incoherent excitation and/or targeted dephased excitation as described in the preceding can inherently be achieved by the multidimensional, spatially selective RF pulse, for example in that the parameters of the multidimensional RF pulse are suitably chosen. It is also possible for the preparation sequence to furthermore include application of a gradient field that dephases the transverse magnetization in the outer region. In other words, it can alternatively or additionally be possible to impress an additional difference phase on the transverse magnetization in the outer region via application of a gradient field. To achieve this, the application of the gradient field can occur with a temporal separation from (or at least partially temporally overlapping with) the multidimensional, spatially selective RF pulse.

With the techniques described above, the signal contribution of the transverse magnetization in the outer region for the MR imaging can be reduced by saturation and/or phase-incoherent excitation and/or targeted dephasing. The signal contribution for the MR signal acquired within the scope of the SSFP measurement sequence thus can be effectively limited to the measurement region. This makes it possible to acquire the MR signal for a comparably smaller number of scan points along the k-space trajectory. In particular, aliasing of signal contributions that accrue from the outer region can be prevented or reduced in the MR image, in particular in comparison to the case in which data from the measurement region would be acquired with the corresponding number of scan points without implementation of the preparation sequence to reduce the signal contribution of the transverse magnetization in the outer region. Such aliasing, given an undersampling of k-space, can arise due to the subsequent Fourier transformation into the image domain.

In the preceding, techniques have primarily been discussed that enable the reduction of the signal contribution of the transverse magnetization within the scope of the preparation sequence. In the following, techniques are discussed that enable the implementation of the preparation sequence during the implementation of the SSFP measurement sequence. In other words, in the following, techniques are discussed that concern the temporally overlapping implementation or the insertion of the preparation sequence with and into the SSFP measurement sequence.

The preparation sequence can include: radiate an RF pulse at the beginning of the preparation sequence to store the transverse magnetization by aligning said transverse magnetization along a longitudinal direction; and, at the end of the preparation sequence, radiate an RF pulse to reestablish the transverse magnetization by aligning the transverse magnetization in a transverse plane orthogonal to the longitudinal direction; for example, both of these RF pulses can be $\alpha/2$ pulses with the same or different algebraic sign.

The initial radiation of the RF pulse to align the transverse magnetization along the longitudinal direction—i.e. to convert the transverse magnetization into longitudinal magnetization—and the final radiation of the RF pulse to switch the longitudinal magnetization back into the transverse plane can have the effect that the preparation sequence can be implemented without the set steady state of the transverse magnetization in the measurement region being significantly disrupted, in particular if two points in time (the one point in time before the preparation sequence and the other point in time after the preparation sequence) are used as comparative references.

In other words, the steady state of the transverse magnetization in the measurement region can be preserved over the duration of the preparation sequence. It is possible to insert the preparation sequence into the SSFP measurement sequence once or multiple times without significantly altering the intrinsic parameters of the imaging.

It is possible for the RF pulses of the SSFP measurement sequence that excites the transverse magnetization to be formed by alternately positive and negative alpha pulses; the RF pulse of the preparation sequence disturbs the transverse magnetization can be a positive alpha/2 pulse; and the RF pulse of the preparation sequence to reestablish the transverse magnetization can be a positive alpha/2 pulse.

The radiation of the RF pulses of the SSFP measurement sequence to excite the transverse magnetization can be repeated with a defined repetition time. A time interval between a defined RF pulse of the SSFP measurement sequence to excite the transverse magnetization and the RF pulse of the preparation sequence to store the transverse magnetization can be equal to half of the repetition time. A time interval between the RF pulse of the preparation sequence to reestablish the transverse magnetization and an additional defined RF pulse of the SSFP measurement sequence to excite the transverse magnetization—which additional defined RF pulse follows the defined RF pulse—can be equal to half of the repetition time.

Appropriate techniques, especially with regard to fat saturation, are known to the man skilled in the art from "Magnetization Preparation During the Steady State: Fat-Saturated 3D TrueFISP" by K. Scheffler et al. in Mag. Reson. Med. 45 (2001) 1075-1080, such that no additional details must be explained here.

In the preceding, techniques have been explained that enable the reduction of the signal contribution of the transverse magnetization in the outer region in MR imaging by means of (for example) saturation, phase-incoherent excitation and/or dephasing of the transverse magnetization. In the following, additional techniques are discussed for the reduction of the signal contribution of the transverse magnetization in the outer region.

Furthermore, the implementation of the preparation sequence can include acquisition of an MR signal of the transverse magnetization in the outer region. Furthermore, the implementation of the SSFP measurement sequence can include acquisition of MR signals of the transverse magnetization for MR imaging of the measurement region. The method according to the present aspect can furthermore include the calculation of a signal contribution of the transverse magnetization in the outer region on the MR signals acquired with the SSFP measurement signal for MR imaging, wherein this calculation occurs based on the MR signals of the transverse magnetization in the outer region that are acquired within the scope of the preparation sequence. The method can furthermore include correction of the MR signals that are acquired with the SSFP measurement sequence via removal of the calculated signal contribution of the transverse magnetization in the outer region.

In other words, by the radiation of the multidimensional, spatially selective RF pulse it can be possible to acquire the MR signal of the transverse magnetization in the outer region, thus an MR signal which selectively images the magnetization dynamic in the outer region. In such a case, specific requirements can be posed for the multidimensional, spatially selective RF pulse, which can in particular be different than preceding requirements for the multidimensional, spatially selective RF pulse. In presently discussed variants, the multidimensional, spatially selective RF pulse can thus be suitable in order to enable an imaging in the outer region.

The acquisition of the MR signals for the MR imaging can then take place within the scope of the SSFP measurement sequence, wherein this acquisition does not need to be particularly spatially selective with regard to the measurement region. In other words, the MR signal acquired within the scope of the SSFP measurement sequence can be [sic] a superimposed signal of the transverse magnetization in the measurement region and the outer region. It can then be possible to calculate the signal contribution of the transverse magnetization in the outer region to the MR signals acquired within the scope of the SSFP measurement sequence and to subsequently eliminate or reduce the signal contribution.

This can be in contrast to techniques described above for the reduction of the signal contribution of the transverse magnetization in the outer region in the MR imaging, in which the reduction is achieved by means of saturation and/or phase-incoherent excitation and/or dephasing. Such techniques discussed above include a direct physical effect on the transverse magnetization in the outer region to reduce the signal contribution on said transverse magnetization. By contrast, the technique according to the invention, which includes the calculation of the signal contribution and the correction of the MR signals that were acquired with the SSFP measurement sequence, can be based predominantly or entirely on a subsequent computational reduction of the signal contribution. It should be understood that, in general, the various techniques to reduce the signal contribution of the transverse magnetization in the outer region can be combined with one another.

The acquisition of the MR signal of the preparation sequence and the calculation of the signal contribution of the transverse magnetization in the outer region can be implemented using MR fingerprinting techniques.

MR fingerprinting techniques are known to those skilled in the art, for example from US 2012/0235678 A1. By varying the MR parameters that are used within the scope of the preparation sequence, a time curve of the magnetization dynamic of the transverse magnetization in the outer region can be achieved which is characteristic of the signal contribution to the MR signals acquired with the SSFP measurement sequence.

It is possible for the preparation sequence to be implemented multiple times, with at least one MR parameter of successively implemented preparation sequences being changed in each repetition. The MR parameters can be selected from among the time between two successively implemented preparation sequences; flip angle of the multidimensional, spatially selective RF pulse; the echo time for the acquisition of the MR signal of the preparation sequence; the phase coding; the phase of the multidimensional, spatially selective RF pulse; the amplitude of the multidimensional, spatially selective RF pulse; the number of applied gradient fields; and the type of applied spatially coding gradient fields.

The calculation of the signal contribution of the transverse magnetization in the outer region to the MR signals acquired with the SSFP measurement sequence can furthermore include the comparison of a time curve of the MR signals acquired within the scope of the preparation sequence for the transverse magnetization in the outer region with pre-calculated model data.

For example, the pre-calculated model data can be obtained by means of suitable simulations. In general, appropriate MR fingerprinting techniques are known to those skilled in the art, such that additional details need not be explained herein.

According to a further aspect, the invention concerns a magnetic resonance system that is designed for MR imaging with an SSFP measurement sequence for a measurement region of an examination subject. The MR system is configured in order to implement the SSFP measurement sequence for the MR imaging in the measurement region, wherein the implementation of the SSFP measurement sequence includes: radiation of RF pulses to excite the transverse magnetization, the radiated RF pulses affecting the transverse magnetization in the measurement region and in an outer region that surrounds and adjoins the measurement region. Furthermore, the MR system is configured to implement a preparation sequence during the implementation of the SSFP measurement sequence to reduce a signal contribution of the transverse magnetization in the outer region in the MR imaging, wherein the implementation of the preparation sequence includes radiating a multidimensional, spatially selective RF pulse that acts in a spatially selective manner on the transverse magnetization in the outer region.

The MR system can be set configured to implement the method for MR imaging with the SSFP measurement sequence according to a further aspect of the present invention.

For such an MR system, effects can be achieved which are comparable to the effects that can be achieved for the method for MR imaging with the SSFP measurement sequence according to a further aspect of the invention.

The features described above and features that are described in the following can be used not only in the, explicitly presented combination, but also in additional combination or in isolation, without departing from the scope of the present invention.

DESCRIPTION OF THE PREFERRED EMBODIMENTS

Figure 1:
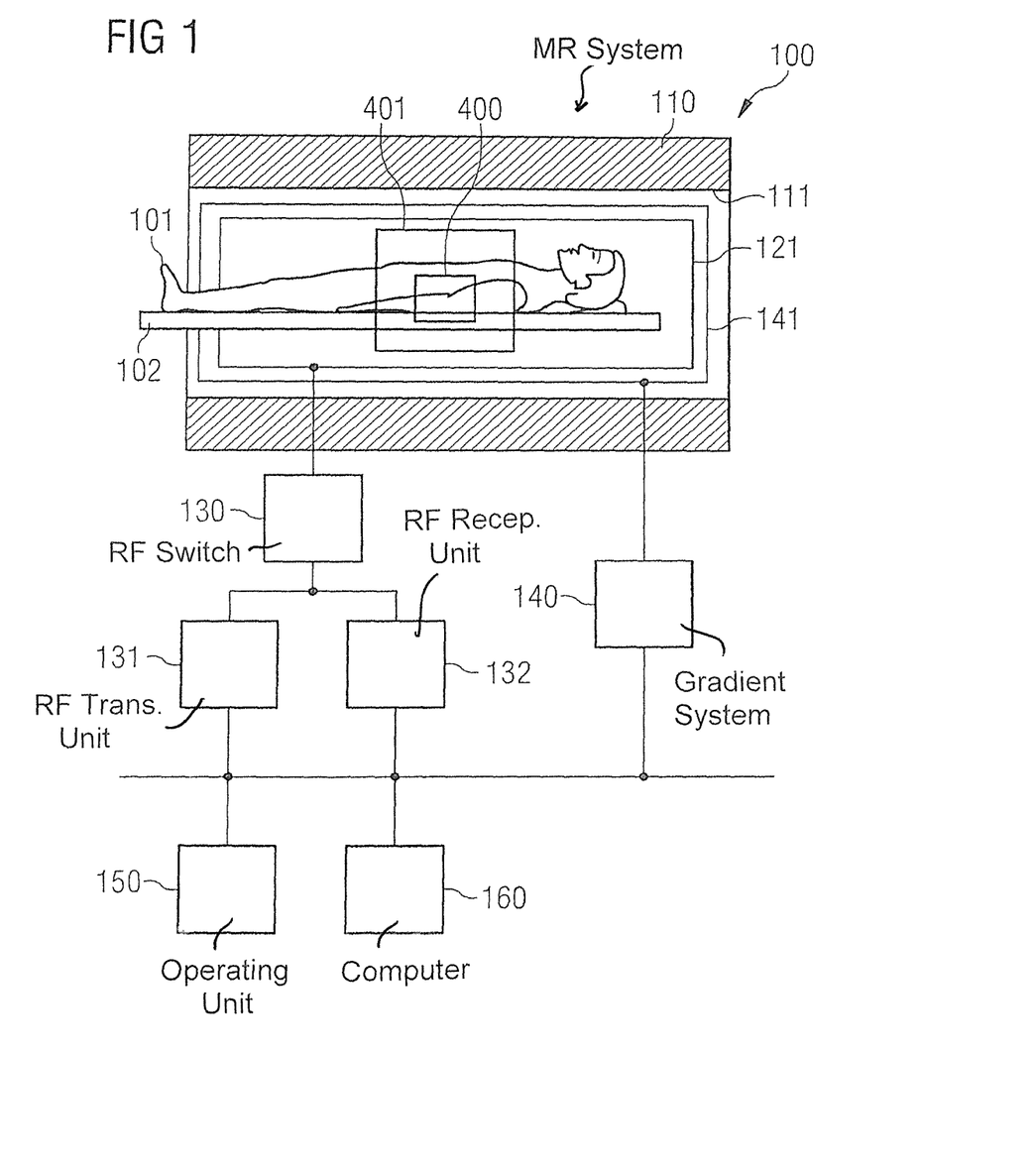
FIG. 1 schematically shows an MR system suitable to implement techniques according to the invention.

In FIG. 1, an MR system 100 is shown that is designed to implement techniques, methods and steps according to the invention. The MR system 100 has a magnet 110 that defines a tube 111. The magnet 110 generates a basic magnetic field parallel to its longitudinal axis. An examination subject—here an examined person 101—on a bed table 102 can be slid into the magnet 110. The MR system 100 furthermore has a gradient system 140 to generate gradient fields that are used for MR imaging and for spatial coding of acquired raw data. The gradient system 140 typically includes at least three separately controllable and gradient coils 141 that are positioned in a well-defined manner relative to one another. The gradient coils 141 enable gradient fields to be applied and switched along defined spatial directions (gradient axes). The corresponding gradient coils 141 are also designated as channels of the gradient system 140. For example, the channels can define a frequency coding, a readout coding and a phase coding. A spatial resolution of the raw data can thereby be achieved.

An RF coil arrangement 121 that can radiate an amplitude-modulated RF excitation pulse into the examined person 101 is provided for the excitation of the polarization of nuclear spins resulting in the basic magnetic field, namely the alignment of the magnetization in the longitudinal direction. A transverse magnetization of the nuclear spins can thereby be generated. To generate such RF excitation pulses, an RF transmission unit 131 is connected via an RF switch 130 with the RF coil arrangement 121. The RF transmission unit 131 can include an RF generator and an RF amplitude modulation unit. The RF excitation pulses can deflect the transverse magnetization slice-selectively in 1D or spatially selectively in 2d/3d out of the steady state.

Furthermore, an RF reception unit 132 is coupled via the RF switch 130 with the RF coil arrangement 121. MR signals of the relaxing transverse magnetization can be acquired via the RF reception unit 132 as raw data, for example via inductive injection into the RF coil arrangement 121.

In general, it is possible to use separate RF coil arrangements 121 for the radiation of the RF excitation pulses by means of the RF transmission unit 131 and for the acquisition of the raw data by means of the RF reception unit 132. For example, for the radiation of RF pulses and/or acquisition of raw data it can be possible to use an RF coil arrangement 121 which comprises an array of RF coils. For example, the RF coil arrangement 121 for the acquisition of the raw data can comprise 32 individual RF coils and be used in such a manner for parallel imaging (ppa imaging, partially parallel acquisition). Appropriate techniques are known to those skilled in the art, so additional details need not be explained herein.

The MR system 100 furthermore has an operating unit 150 (console), for example, can include a monitor, a keyboard, a mouse, etc. User inputs can be detected and shown as an output to the user by means of the operating unit 150. For example, it can be possible for individual operating modes or operating parameters of the MR system to be set by the user and/or automatically and/or via remote control by means of the operating unit 150.

Furthermore, the MR system 100 has a computer 160. For example, the computer 160 can be configured to generate an MR image from the raw data acquired by means of the RF reception unit. For this purpose, for example, techniques for post-processing apparatus imaging can be applied and/or corresponding Fourier transformations can be applied between the positional frequency space in which the raw data exist and the positional space in which the MR image is obtained. For example, the computer 160 can furthermore control the implementation of an MR measurement sequence. For this, the units 131, 132, 140 can be controlled and RF pulses can be radiated such that gradient fields are applied and MR signals are acquired.

By means of the MR measurement sequence MR imaging for a measurement region 400, which includes an inside of the examined person 101, can be implemented. As is clear from FIG. 1, the measurement region 400 is surrounded by an outer region 401. It can be worthwhile to image only the measurement region 400 as an ROI by means of the MR imaging, while it can be unnecessary to acquire the outer region 401 via the MR imaging. Techniques are presented in the following that allow the measurement region 400 to be acquired selectively by means of MR imaging, and to reduce or suppress a signal contribution of the transverse magnetization in the outer region 401.

The measurement region 400 can be selectively imaged as an ROI with a relatively short measurement duration. In particular, in an application such as cardiac imaging it can be worthwhile to achieve such a reduced measurement duration in order to reduce movement artifacts via suitable techniques.

Although the individual units of the MR system 100 that are discussed in the preceding are depicted separately in FIG. 1, it should be understood that individual units can be implemented in combination with one another (for example as software and/or hardware), for instance at a central computer.

Figure 2:
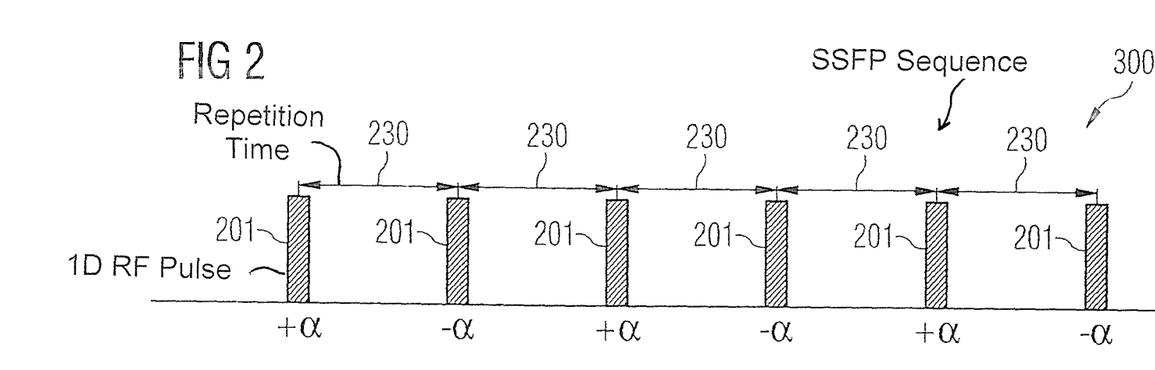
FIG. 2 shows a known SSFP measurement sequence.

An SSFP measurement sequence 300 is shown in FIG. 2. The SSFP measurement sequence 300 of FIG. 2 is what is known as a TrueFISP measurement sequence in which a series of RF pulses 201 is radiated with a defined repetition time 230. The RF pulses 201 are what are known as alternating +α, −α pulses. This can be interpreted microscopically as a deflection of spins by an angle α of less than 90° relative to the longitudinal direction. A lower amplitude of the transverse magnetization is achieved as an effect; however, a portion of the longitudinal magnetization is maintained and can be excited with one of the subsequent RF pulses 201. A steady state of the transverse magnetization develops. Corresponding techniques for saturation given short repetition time 230, as well as the RF pulses 201 with reduced pulse angles, are known in principle to those skilled in the art, such additional details need not be explained herein.

The RF pulses 201 of the SSFP measurement sequence 300 can be conventional RF pulses to excite the transverse magnetization. In particular, the RF pulses 201 can only have a 1D spatial selectiveness with regard to a slice selection direction (which can typically be oriented parallel to the longitudinal direction of the tube 111 of the MR system 100). For example, this can occur by the application of a slice-selection gradient field by means of the gradient unit 140. In such a case, the RF pulses 201 can in particular have no spatial selectiveness orthogonal to the slice selection direction, such that transverse magnetization is excited both within the measurement region 400 and within the outer region 401. The signal contribution of the transverse magnetization in the outer region can arise in the MR imaging.

Figure 3:
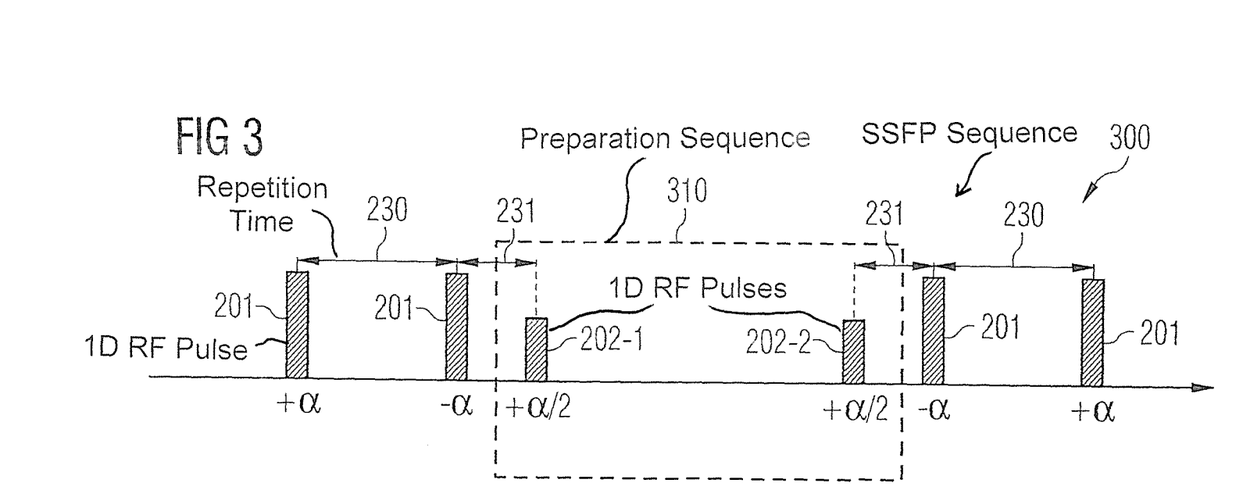
FIG. 3 illustrates an SSFP measurement sequence according to the invention that includes a preparation sequence.

A corresponding SSFP measurement sequence 300 is shown in FIG. 3, wherein a preparation sequence 310 (represented with dashed line in FIG. 3) is implemented during the implementation of the SSFP measurement sequence 300. In other words: the SSFP measurement sequence 300 for the implementation of the preparation sequence 310 is interrupted or, respectively, the preparation sequence 310 is inserted into the SSFP measurement sequence 300. As can be seen from a comparison of FIGS. 2 and 3, the points in time at which the RF pulses 201 of the TrueFISP measurement sequence are implemented before and after the preparation sequence 310 are namely comparable. However, the algebraic sign of the RF pulses 301 is inverted after the preparation sequence 310.

The preparation sequence 310 enables a signal contribution of the transverse magnetization in the outer region 401 to be reduced in the MR imaging. Details of the preparation sequence 310 are explained in the following.

As can be seen from FIG. 3, the preparation sequence 310 includes the radiation of an α/2-RF pulse 202-1 at the beginning of the preparation sequence 310. Furthermore, an α/2-RF pulse 202-2 is radiated at the end of the preparation sequence 310. The RF pulse 202-1 has the effect that the transverse magnetization from the transverse plane is folded into the steady state along the longitudinal direction. The RF pulse 202-2 accordingly has the effect that the transverse magnetization is reestablished at the end of the preparation sequence 310 by folding the transverse magnetization (which has in the meanwhile been stored along the longitudinal direction) back into the transverse plane. Depending on the algebraic sign of the α/2-RF pulse 202-2, the algebraic sign of the subsequent α-RF pulse 201 can vary. For example, a positive (negative) α/2-RF pulse 202-2 can follow a negative (positive) α-RF pulse 201. Afterward the RF pulses 201 can have alternating algebraic signs.

For example, it is possible that the RF pulses 202-1, 202-2 are conventional RF pulses which only have a 1D spatial selectiveness, for example. In other words, this means that the RF pulses 202-1, 202-2 in the transverse plane act in the same manner on the transverse magnetization in the measurement region 400 and the outer region 401.

Furthermore, from FIG. 3 it can be seen that a duration 231 between the RF pulse 202-1 at the beginning of the preparation sequence 310 and the chronologically immediately preceding RF pulse 201 of the SSFP measurement sequence 300 is equal to half of the repetition time 230. The same applies to the duration 231 between the RF pulse 202-2 at the end of the preparation sequence 310 and the chronologically immediately following RF pulse 201 of the SSFP measurement sequence 300.

With a chronological sequence of RF pulses 201, 202-1, 202-2 as discussed above with regard to FIGS. 2 and 3, steady state of the transverse magnetization is not (or is not significantly) disrupted by the insertion of the preparation sequence 310 into the SSFP measurement sequence 300. The steady state of the transverse magnetization in the measurement region 400 can be stored to the greatest possible extent by being folded back into the longitudinal direction in the interim and being subsequently reestablished with the aid of the RF pulses 202-1, 202-2.

Although the duration of the preparation sequence 310 can be limited to define values, it cannot be bounded. Nevertheless, it can be desirable to minimize a complete duration required for implementation of the preparation sequence 310 or, respectively, to temporally limit it to a few milliseconds. Otherwise, the steady state can be disrupted and/or the measurement duration can be increased. In the following, techniques are explained which enable the fast implementation of the preparation sequence 310 using multidimensional, spatially selective RF pulses to reduce the signal contribution of the transverse magnetization in the outer region 401 to the MR imaging.

Figure 4:
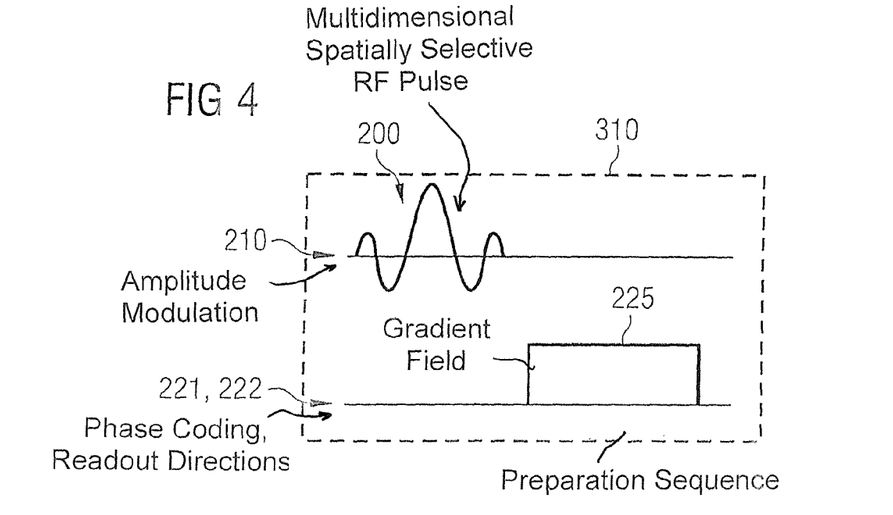
FIG. 4 illustrates the preparation sequence of FIG. 3 in greater detail.

The preparation sequence 310 is shown in greater detail in FIG. 4. The RF pulses 202-1, 202-2 are not shown in FIG. 4 for purposes of improved clarity. An amplitude modulation 210 of a multidimensional, spatially selective RF pulse 200 is represented in purely schematic form as a sinc-like function in FIG. 4. However, in general the amplitude modulation 210 of the multidimensional, spatially selective RF pulse 200 can assume a different time curve. Furthermore, a gradient field 225 along a phase coding direction 221 and a readout direction 222 is shown in FIG. 4. The gradient field 225 has a rectangular time curve. The transverse magnetization in the outer region can be dephased by means of the gradient field 225. In general, it is possible that the amplitude or, respectively, the duration or the time curve of the gradient field 225 assume different values. The gradient field 225 oriented along the phase coding direction 221 and/or along the readout direction 222 is optional. A reduction of the signal contribution of the transverse magnetization in the outer region 401 can namely be achieved not only by a dephasing by means of the gradient field 225 but also alternatively or additionally by a saturation of the transverse magnetization in the outer region 401 and/or a phase-incoherent excitation via the multidimensional, spatially selective RF pulse 200 and/or a dephasing by the multidimensional, spatially selective RF pulse 200.

Figure 5:
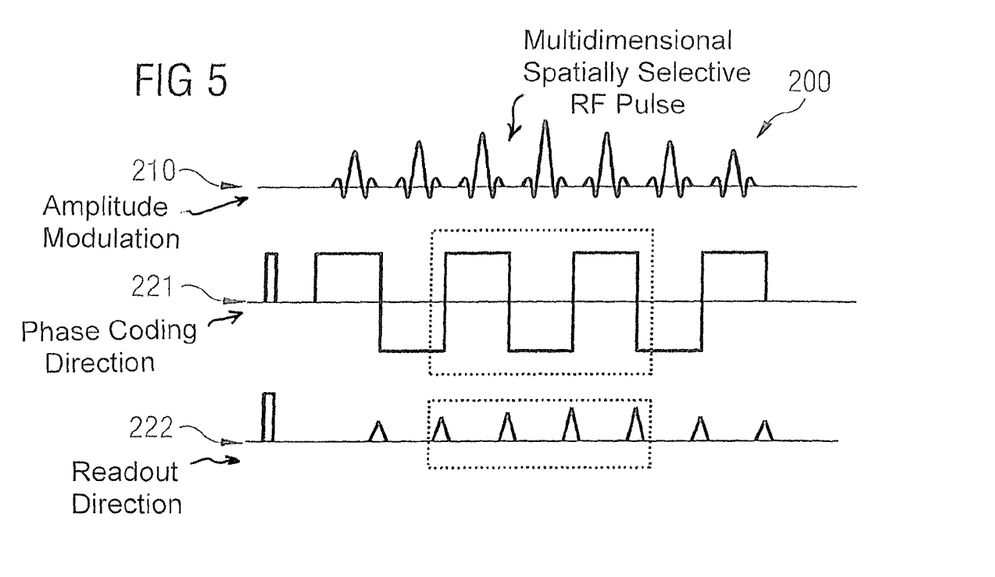
FIG. 5 illustrates a multidimensional, spatially selective RF pulse.
Figure 6:
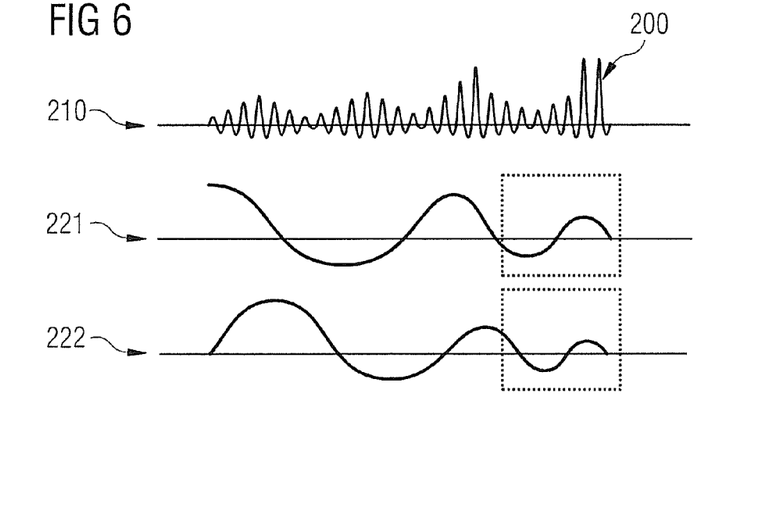
FIG. 6 illustrates an additional multidimensional, spatially selective RF pulse.

Such multidimensional, spatially selective RF pulses 200 are depicted with regard to FIGS. 5 and 6. In general, such multidimensional, spatially selective RF pulses can achieve a spatial selectiveness via use of an amplitude modulation 210 of a radio-frequency of the RF pulse 200 and by the use of spatially coding gradient fields during the application of the radio-frequency pulses 200. In other words: via suitable selection of the parameters of the multidimensional, spatially selective RF pulse 200 it can be achieved that a defined k-space trajectory is followed in the excitation, and that the transverse magnetization in the outer region 401 is selectively affected.

For example, in FIG. 5 a multidimensional, spatially selective RF pulse 200 is shown with a Cartesian k-space trajectory. A multidimensional, spatially selective RF pulse 200 with a spiral-shaped k-space trajectory is shown in FIG. 6. A region of the gradient fields which corresponds to a center of k-space is depicted with dotted lines in FIGS. 5 and 6.

In general, it is not necessary that the parameters of the multidimensional, spatially selective RF pulse are selected such that a phase-coherent excitation of the transverse magnetization is achieved. In other words: it can be unnecessary that the transverse magnetization excited via the multidimensional, spatially selective RF pulse 200 has a well-defined phase position. This can in particular be the case when the multidimensional, spatially selective RF pulse 200 is used for a saturation by complete deflection of the longitudinal magnetization in the outer region 401 out of the steady state.

Figure 7:
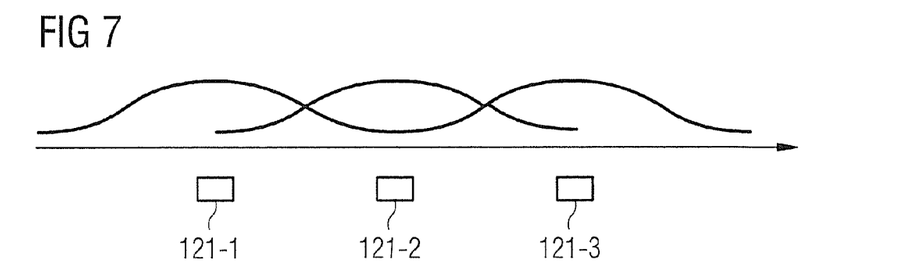
FIG. 7 shows a spatial sensitivity of multiple RF coils which can be used for parallel transmission in multidimensional, spatially selective RF pulses.

With regard to FIG. 1, it has been discussed above that it is possible to use an RF coil arrangement 121 having multiple RF coils to excite the transverse magnetization and/or to acquire MR signals. A spatial curve of the sensitivity of three RF coils 121-1, 121-2, 121-3 is shown in FIG. 7. As is clear from FIG. 7, the sensitivity of the different RF coils 121-1, 121-2, 121-3 respectively has a maximum of the sensitivity at different points in positional space. This alternatively or additionally achieves the spatial selectiveness of the multidimensional, spatially selective RF pulse 200 of the preparation sequence 310 via parallel transmission techniques. By constructive and destructive superposition of the amplitudes of the alternating electromagnetic fields emitted by the different RF coils 121-1, 121-2, 121-3, the spatial selectiveness can be achieved given a simultaneous reduction of the duration required to implement the multidimensional, spatially selective RF pulse 200. Appropriate parallel transmission techniques are known in principle to those skilled in the art, such that additional details need not be explained herein.

Figure 8:
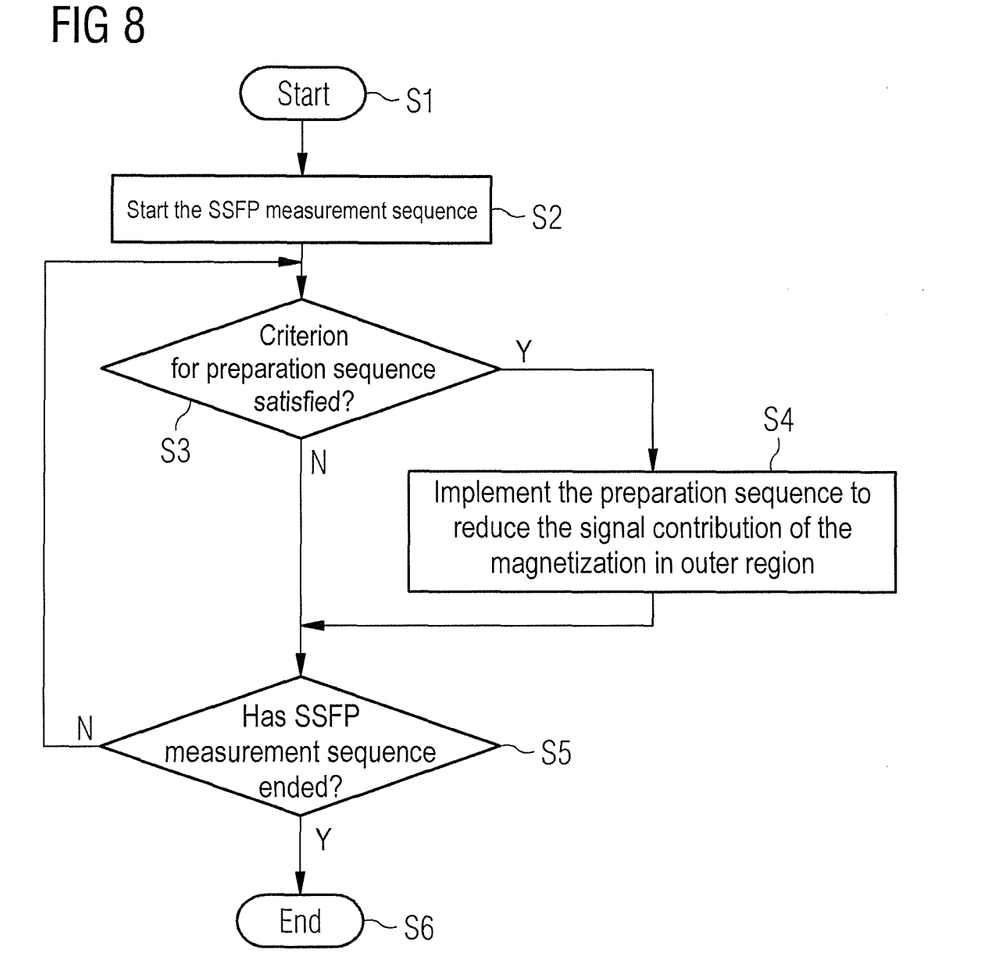
FIG. 8 is a flowchart for a method according to the invention for MR imaging which includes the preparation sequence.

A flowchart of a method according to the invention for MR imaging by means of an SSFP measurement sequence 300 is shown in FIG. 8. The method begins in Step S1. In Step S2, the implementation of the SSFP measurement sequence 300 is beginning. As was discussed in the preceding with regard to FIG. 2, the implementation of the SSFP measurement sequence 300 includes the repeated radiation of RF pulses 201 (for example with defined repetition time 230 to excite the transverse magnetization), wherein the radiated RF pulses 201 act on the transverse magnetization in the measurement region 400 and in the outer region 401.

In Step S3 a check is made as to whether a criterion for implementation of the preparation sequence 310 is satisfied. In other words: in Step S3 a check is made as to whether the implementation of the preparation sequence 310 is necessary and/or possible at a defined point in time during the SSFP measurement sequence 300. For example, it can be possible that the preparation sequence 310 is implemented repeatedly with a defined repetition rate and/or a defined minimum time interval. For example, the repetition rate of the preparation sequence 310 is dependent on a relaxation time of the transverse magnetization, in particular in an outer region 401. Moreover, the insertion of the preparation sequence 310 into the SSFP measurement sequence 300 can occur such that a defined time interval 231 is maintained between the RF pulses 201 of the SSFP measurement sequence 300 and the RF pulses 202-1, 202-2 to store the transverse magnetization within the scope of the preparation sequence 310. This criterion can also be checked within the scope of Step S3.

If it is established in Step S3 that the criterion or criteria for the implementation of the preparation sequence 310 is/are not satisfied, in Step S5 a check is made as to whether the SSFP measurement sequence has already ended, i.e. whether all MR signals or, respectively, raw data for the MR imaging have already been acquired within the scope of the SSFP measurement sequence at 100. If this is not the case, Step S3 is implemented again, or the SSFP measurement sequence is continued. However, if the SSFP measurement sequence has ended, the method ends in Step S6.

If it is established in Step S3 that the criterion for implementation of the preparation sequence 310 has been satisfied, the preparation sequence 310 is implemented in Step S4 to reduce the signal contribution of the magnetization in the outer region 401. The implementation of the preparation sequence 310 in Step S4 includes the radiation of a multidimensional, spatially selective RF pulse 200 which acts in a spatially selective manner on the transverse magnetization in the outer region 401. In the following, Step S4 is explained in detail with regard to FIGS. 9 and 10 for various scenarios of the invention.

Figure 9:
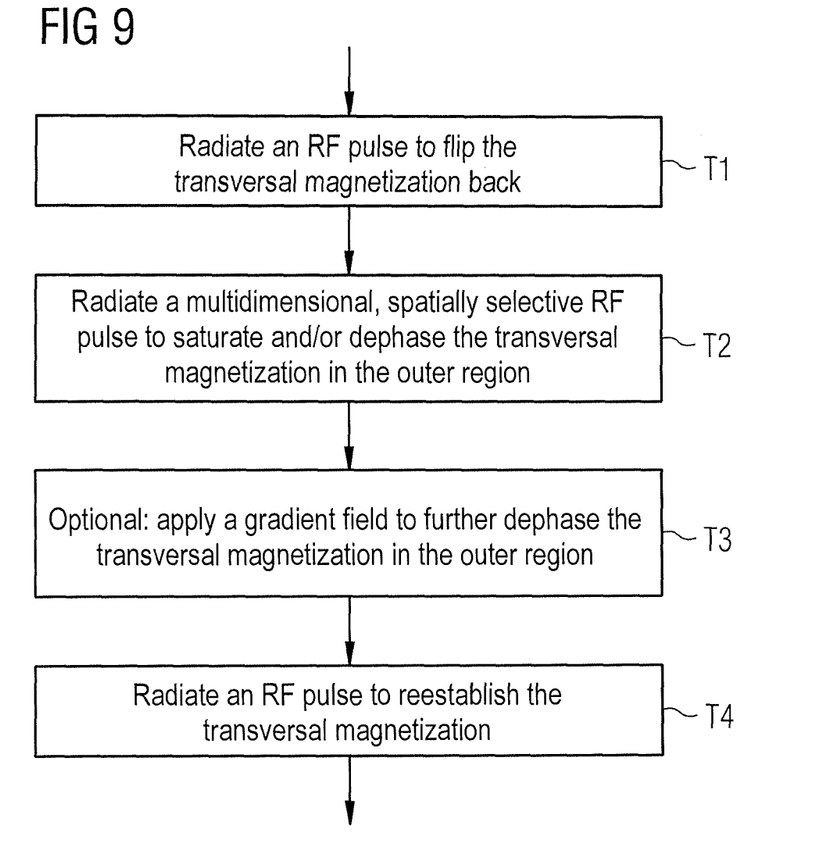
FIG. 9 is a flowchart for the preparation sequence of FIG. 8 in greater detail.

Referring first to FIG. 9: in Step T1, the radiation of an RF pulse 202-1 to causes the transverse magnetization to align along the longitudinal direction can take place at the beginning of the preparation sequence 310, meaning that a flip of the transverse magnetization back into the steady state can take place. For example, this can occur by means of an α/2-pulse as discussed with regard to FIG. 3.

The radiation of a multidimensional, spatially selective RF pulse 200 subsequently takes place in Step T2 to saturate and/or dephase the transverse magnetization in the outer region 401.

The application of a gradient field 225 to further dephase the transverse magnetization in the outer region 401 optionally takes place in Step T3.

The radiation of an additional RF pulse 202-2 to reestablish the transverse magnetization via alignment of said transverse magnetization in a transverse plane orthogonal to the longitudinal direction takes place in Step T4, at the end of the preparation sequence 310. In other words: in Step T4, the transverse magnetization previously stored in Step T1 is reestablished. The implementation of the SSFP measurement sequence 300 can then be continued.

Figure 10:
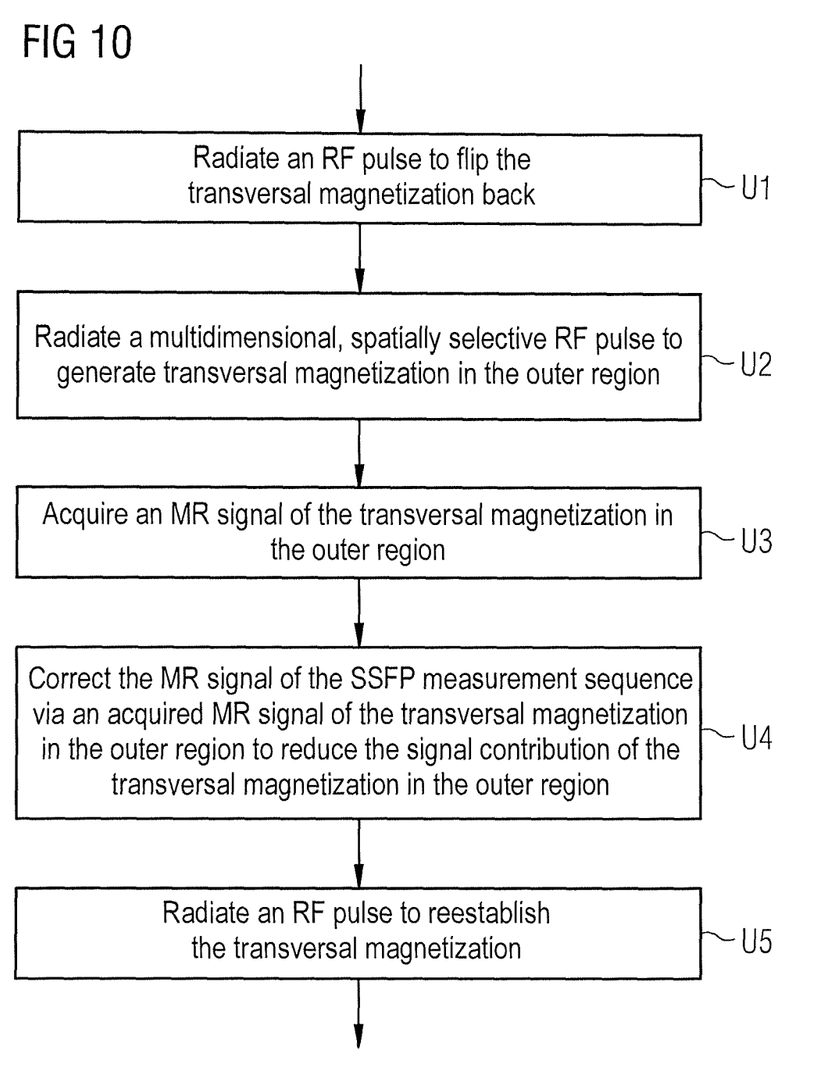
FIG. 10 is a flowchart for the preparation sequence of FIG. 8 in greater detail.

An additional preparation sequence 310 is illustrated in FIG. 10 by means of a flow chart. Steps U1 and U4 correspond to Steps T1 and T4 of FIG. 9 and serve to store the transverse magnetization during the implementation of Steps U2 and U3. This allows the implementation of Steps U2 and U3 to have no or only little influence on the intrinsic properties of the MR imaging by means of the SSFP measurement sequence 300.

The radiation of a multidimensional, spatially selective RF pulse 200 to generate transverse magnetization in the outer region 401 takes place in Step U2. In contrast to Step T2, as discussed in the preceding with reference to FIG. 9 the multidimensional, spatially selective RF pulse of Step U2 can be intended to achieve a phase-coherent excitation of the transverse magnetization in the outer region.

It can therefore be possible to acquire an MR signal of the transverse magnetization in the outer region in Step U3. Based on the MR signal acquired in Step aU3, a signal contribution of the transverse magnetization in the outer region on the MR signals acquired with the SSFP measurement sequence can be calculated and the MR signals can be corrected accordingly. The signal contribution of the transverse magnetization in the outer region to the MR imaging can thereby be suppressed or, respectively, reduced.

It is possible that Steps U3 and U4 are implemented by means of the MR fingerprinting technique. For example, for this multiple preparation sequences 310 can be inserted into the SSFP measurement sequence 300. Different MR parameters can be varied between the repeated executions of the preparation sequence 310. The obtained MR signals can be compared with pre-calculated model data, and the signal contribution of the transverse magnetization in the outer region to the MR imaging can be calculated in such a manner.

Appropriate MR fingerprinting techniques are known to those skilled in the art, such that additional details need not be explained herein.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) data from a subject, comprising:
   operating an MR data acquisition unit, with an examination subject situated therein, to implement a "free precession of transverse magnetization in the steady state"-type (SSFP) data acquisition sequence;
   in said SSFP data acquisition sequence, operating a radio-frequency (RF) radiator to radiate RF pulses that produce a transverse magnetization of nuclear spins in a measurement region of the examination subject and in an outer region of the examination subject that surrounds and adjoins said measurement region, said nuclear spins then emitting an MR signal;
   also in said SSFP data acquisition sequence, operating said MR data acquisition unit to execute a preparation sequence that reduces a signal contribution, to said MR signal, of nuclear spins having said transverse magnetization in said outer region, by radiating, via said RF radiator, a multidimensional, spatially selective RF pulse that by itself spatially selectively acts in at least two dimensions on said transverse magnetization of said nuclear spins in said outer region; and
   operating an RF detector of said MR data acquisition unit, in said SSFP data acquisition sequence, to detect said MR signals and to enter the detected MR signals into an electronic memory, organized as k-space, to produce an electronically accessible data file in said electronic memory.

2. A method as claimed in claim 1 comprising operating said MR data acquisition unit for saturate the transverse magnetization of said nuclear spins in said outer region by radiating said multidimensional, spatially selective RF pulse.

3. A method as claimed in claim 1 comprising operating said MR data acquisition unit to phase-incoherently excite said transverse magnetization of said nuclear spins in said outer region by radiating said multidimensional, spatially selective RF pulse.

4. A method as claimed in claim 1 comprising operating said MR data acquisition unit to dephase said transverse magnetization of said nuclear spins in said outer region by radiating said multidimensional, spatially selective RF pulse.

5. A method as claimed in claim 1 comprising operating said MR data acquisition unit to apply a gradient field, with a gradient system of said MR data acquisition unit, which dephases said transverse magnetization of said nuclear spins in said outer region.

6. A method as claimed in claim 1 comprising operating said MR data acquisition unit in said operation sequence to make said multidimensional, spatially selective RF pulse spatially selective by amplitude modulation of said multidimensional, spatially selective RF pulse by activating a spatially selective gradient field, during radiation of said multidimensional, spatially selective RF pulse, with a gradient system of said MR data acquisition unit.

7. A method as claimed in claim 1 wherein said RF radiator comprises a plurality of RF coils, and comprising operating said MR data acquisition unit to make said multidimensional, spatially selective RF pulse spatially selective by radiating chronologically overlapping RF energy from multiple RF coils, among said plurality of RF coils.

8. A method as claimed in claim 1, comprising:
   operating said MR data acquisition unit to radiate, at a beginning of said preparation sequence, an RF pulse that aligns said nuclear spins along a longitudinal direction of said MR data acquisition unit; and
   operate said MR data acquisition unit to radiate, at an end of said preparation sequence, a further RF pulse that aligns said transverse magnetization of said nuclear spins in a transverse plane that is orthogonal to said longitudinal direction.

9. A method as claimed in claim 8, comprising:
   operating said MR data acquisition unit, in said SSFP data acquisition sequence, to radiate excitation RF pulses that are alternating positive and negative a pulses;
   operating said MR data acquisition unit to radiate said RF pulse at said beginning of said preparation sequence as a positive $\alpha/2$ pulse; and
   operating said MR data acquisition unit to radiate said RF pulse at said end of said preparation sequence as a positive $\alpha/2$ pulse.

10. A method as claimed in claim 8, comprising:
   repeating radiation of said RF excitation pulses in said SSFP data acquisition sequence with a defined repetition time;
   operating said MR data acquisition unit to radiate said RF pulse at said beginning of said preparation sequence at a time interval, following a selected RF excitation pulse of said SSFP data acquisition sequence, that is half of said repetition time; and
   operating said MR data acquisition unit to radiate said RF pulse at said end of said preparation sequence at a time interval following a different selected RF excitation pulse of said SSFP data acquisition sequence, which is half of said repetition time.

11. A method as claimed in claim 1 comprising:
   operating said MR data acquisition unit, in said SSFP data acquisition sequence, to detect said MR signals from each of said measurement region and said outer region;
   operating said MR data acquisition unit in said preparation sequence to also detect MR signals from the transverse magnetization of said nuclear spins said outer region;
   in a processor, automatically calculating a signal contribution of said transverse magnetization of the nuclear spins in said outer region to said MR signals detected in said SSFP data acquisition unit sequence, based on said MR signals detected from said transverse magnetization of said nuclear spins in said outer region in said preparation sequence; and in said processor, correcting said MR signals detected in said SSFP data acquisition sequence by removal therefrom of the calculated signal contribution of the transverse magnetization of the nuclear spins in said outer region.

12. A method as claimed in claim 11 comprising operating said MR data acquisition unit to detect said MR signal from said transverse magnetization of said nuclear spins in said outer region in said preparation sequence, and calculating said signal contribution thereof, using an MR fingerprinting technique.

13. A method as claimed in claim 11, comprising:

operating said MR data acquisition unit to execute said preparation sequence multiple times;

operating said MR data acquisition unit, in successive repetitions of said preparation sequence, with at least one MR parameter of said MR data acquisition unit being different in the respective successive repetitions; and selecting said at least one MR parameter from the group consisting of a time between said successively repeated preparation sequences, a flip angle of said multidimensional, spatially selective RF pulse, an echo time for detection of said MR signal in the preparation sequence, phase coding produced by a gradient field activated by a gradient system of said MR data acquisition unit in said SSFP data acquisition sequence, a phase of said multidimensional, spatially selective RF pulse, an amplitude of said multidimensional, spatially selective RF pulse, a number of gradient fields applied by a gradient system of said MR data acquisition unit during said SSFP data acquisition sequence, and a type of spatially selective gradient fields applied by a gradient coil system of said MR data acquisition unit in said SSFP data acquisition sequence.

14. A method as claimed in claim 11, comprising:

calculating said signal contribution of the transverse magnetization of nuclear spins in said outer region by comparing a time curve of said MR signals detected in said preparation sequence for said transverse magnetization of said nuclear spins in the outer region with pre-calculated model data.

15. A method as claimed in claim 1 comprising operating said MR data acquisition unit to radiate said multidimensional, spatially selective RF pulse in said preparation sequence with a pulse configuration that does not affect said transverse magnetization of nuclear spins in said measurement region.

16. An apparatus for acquiring magnetic resonance (MR) system, comprising:

an MR data acquisition unit comprising a radio-frequency (RF) radiator, and an RF detector and an electronic memory;

a control computer configured to operate the MR data acquisition unit, with an examination subject situated therein, to implement a "free precession of transverse magnetization in the steady state"-type (SSFP) data acquisition sequence;

said control computer, in said SSFP data acquisition sequence, being configured to operate the RF radiator to radiate RF pulses that produce a transverse magnetization of nuclear spins in a measurement region of the examination subject and in an outer region of the examination subject that surrounds and adjoins said measurement region, said nuclear spins then emitting an MR signal;

said control computer, also in said SSFP data acquisition sequence, being configured to operate said MR data acquisition unit to execute a preparation sequence that reduces a signal contribution, to said MR signal, of nuclear spins having said transverse magnetization in said outer region, by radiating, via said RF radiator, a multidimensional, spatially selective RF pulse that by itself spatially selectively acts in at least two dimensions on said transverse magnetization of said nuclear spins in said outer region; and said control computer being configured to operate the RF detector of said MR data acquisition unit, in said SSFP data acquisition sequence, to detect said MR signals and to enter the detected MR signals into the electronic memory, organized as k-space, to produce an electronically accessible data file in said electronic memory.

* * * * *